United States Patent [19]

Katou et al.

[11] Patent Number: 5,518,432
[45] Date of Patent: * May 21, 1996

[54] METHOD FOR MANUFACTURING THIN-FILM EL DEVICE

[75] Inventors: Hisato Katou, Yokosuka; Tomoyuki Kawashima; Kazuyoshi Shibata, both of Yokohama; Harutaka Taniguchi, Yokosuka; Shinichi Nakamata, Kanagawa, all of Japan

[73] Assignee: Fuji Electric Company, Ltd., Kawasaki, Japan

[*] Notice: The portion of the term of this patent subsequent to Sep. 17, 2013, has been disclaimed.

[21] Appl. No.: 257,630

[22] Filed: Jun. 7, 1994

Related U.S. Application Data

[63] Continuation-in-part of Ser. No. 122,349, Sep. 17, 1993, abandoned.

[30] Foreign Application Priority Data

| Sep. 24, 1992 | [JP] | Japan | 4-253345 |
| Nov. 24, 1992 | [JP] | Japan | 4-312497 |
| Jun. 8, 1993 | [JP] | Japan | 5-136299 |

[51] Int. Cl.$^6$ ...................................................... H01J 9/22
[52] U.S. Cl. ........................ 445/10; 445/24; 445/58; 204/192.26
[58] Field of Search .................... 445/10, 24, 58; 204/192.26, 1

[56] References Cited

U.S. PATENT DOCUMENTS

| 3,803,438 | 4/1974 | Hanak | 204/192.26 |
| 4,675,092 | 6/1987 | Baird et al. | 204/192.26 |

OTHER PUBLICATIONS

Rawlins et al., "Sputtered Zinc Sulphide Films..." *J. Matls. Sci.*, vol. 7, No. 3 (1972) 257–264.

Hanak, "Electroluminescence In ZnS: $Mn_x$: $Cu_y$..." Proc. 6th Internl. Vacuum Congr. 1974; Japan. J. Appl. Phys. Suppl. 2, Pt. 1, 1974.

*Primary Examiner*—P. Austin Bradley
*Assistant Examiner*—Jeffrey T. Knapp
*Attorney, Agent, or Firm*—Rossi & Associates

[57] ABSTRACT

A method for manufacturing a thin-film EL device utilizes a Zn-Mn target that contains less Mn than the optimum Mn concentration on the basis of the finding that the light-emitting layer grown by the sputtering method contains more Mn than in the target. Manganese concentration on the target surface layer is controlled by changing the area ratio between ZnS and Mn exposed on the surface of the target. Manganese concentration on the target surface is controlled at preferably from 0.3 to 0.4 wt % when the target surface is sulfurized during sputtering and less than 0.1 wt % when the target surface is not sulfurized.

7 Claims, 2 Drawing Sheets

METHOD FOR MANUFACTURING THIN-FILM EL DEVICE

This is a continuation-in-part of application Ser. No. 08/122,349 filed Sep. 17, 1993, now abandoned.

BACKGROUND OF THE INVENTION

The present invention relates to a method for manufacturing a thin-film electroluminescence (hereinafter referred to as EL) device having a light-emitting layer that comprises zinc sulfide (ZnS) to which manganese (Mn) is added to provide the light-emitting centers.

Thin-film EL devices, which are totally solidified flat display devices with high resolution and suitable for obtaining a large display screen, have recently drawn much attention. Thin-film EL devices have a dual insulated structure, as shown in FIG. 1, in which a transparent electrode 2, the first insulation layer 3, an EL light-emitting layer 4, the second insulation layer 5, and a back electrode 6 are laminated on a glass substrate 1. Among these element layers, the light-emitting layer 4 in the EL device is formed with zinc sulfide (ZnS) as the base material, to which a small amount of manganese (Mn) is added to provide the light-emitting centers. Light is emitted from the EL device by applying an alternating electric field between the transparent electrode 2 and the back electrode 6. For obtaining practically acceptable luminance of 70 cd/m$^2$ or higher, the concentration of the light-emitting center material in the light-emitting layer 4 should be optimal and the ratio of the Mn concentration expressed by Mn/(ZnS+Mn) should preferably be about 0.5 weight % (or in the range of from 0.4 weight % to 0.6 weight %.

As methods for forming this light-emitting layer of an EL device, the vacuum deposition method, the atomic layer epitaxial growth method (ALE method) which may be classified into the CVD method, and the sputtering method have been investigated. Of these methods, the sputtering method offers the superior productivity, because a uniform film is grown by the sputtering method over a large area with high film growth rate. Among the miscellaneous variations of the sputtering method, a reactive sputtering method disclosed in the Japanese Patent laid open S62-271396, which employs a zinc (Zn) target and a hydrogen sulfide (H$_2$S) gas, is evaluated to be one of the best suited film fabrication methods for obtaining a uniform and high quality light-emitting layer. Japanese Patent laid open S62-271396 discloses that an excellent light-emitting layer is obtained by employing an inert sputtering gas containing from 5 to 20 volume % of hydrogen sulfide (H$_2$S) and a substrate heated from 100° to 350° C. Japanese Patent laid open S62-271396 discloses a Zn-Mn alloy target and numerically estimates a Mn concentration Mn/(ZnS+Mn) in the Zn-Mn alloy target to be 0.8 wt % for obtaining a light-emitting layer containing the optimum 0.5 wt % of Mn in Mn/(ZnS+Mn) concentration.

However, Ono pointed out low luminance of the light-emitting layer grown by the sputtering method in Acta Polytechnica Scandinavia, Applied Physics Series, No. 170 (5th International Workshop on Electroluminescence), pp. 41–48. The inventors of the present invention discovered that this low luminance is caused by large discrepancy of the composition of the grown light-emitting layer from the composition of the sputtering target. The composition discrepancy is caused by differences in the physical properties of constituent zinc (Zn), sulfur (S) and manganese (Mn) elements relevant to the sputtering process including sputtering rate, vapor pressure etc. Because the vapor pressures of zinc and manganese atoms are high and because zinc and manganese atoms vaporize from the substrate surface especially when the substrate is heated up the elevated temperatures, Mn concentration in the light-emitting layer grown by the reactive sputtering method becomes much higher than that in the sputtering target. FIG. 3 is a graph showing relationship between the Mn/(ZnS+Mn) concentration ratio of light-emitting layer relative to the Mn/(ZnS+Mn) concentration in the target and the substrate temperature. In FIG. 3, line 21 represents the Mn/(ZnS+Mn) concentration ratio for a target the surface of which is metallic and line 22 represents the Mn/(ZnS+Mn) concentration ratio for a target the surface of which is sulfurized. We know from FIG. 3 that the Mn concentration in the light-emitting layer is from 1.5 to 8 times higher than that in the target. We know also from FIG. 3 that the Mn concentration in the light-emitting layer depends greatly on the substrate temperature and surface state of the target. Consequently, the luminance of the light-emitting layer grown from a target the surface of which is sulfurized is high. Therefore, the desired optimum Mn concentration of around 0.5 wt % in the light-emitting layer is not obtained by the reactive sputtering method in so far as a target is employed the Mn/Zn ratio of which coincides with the desired Mn/Zn ratio in the light-emitting layer.

In view of the foregoing, an object of the present invention is to provide a method for manufacturing a thin-film EL device that facilitates growing by the reactive sputtering technique a ZnS light-emitting layer which contains an optimum Mn concentration.

SUMMARY OF THE INVENTION

The object of the present invention is achieved by a method for manufacturing a thin-film EL device that comprises a step of fabricating a target that comprises zinc and less than 0.5 wt % of Mn contained at least in a surface layer; and a step of growing a light-emitting layer that comprises ZnS and Mn added to donate light-emitting centers by the reactive sputtering technique from the target in a sputtering gas that comprises a sulfur compound.

The target, the surface of which is sulfurized during sputtering process, contains at least in the surface layer 0.3 to 0.4 wt % of Mn.

The target, the surface of which is not sulfurized during sputtering process, contains at least in the surface layer less than 0.1 wt % of Mn.

The target is fabricated by co-melting Zn and Mn.

The target is fabricated under a press machine by pressing a mixture of Zn powder and Mn powder to form a target tablet.

The target comprises an exposed Mn region disposed on a zinc substrate and the exposed Mn region has an area ratio of a predetermined wt % of Mn multiplied by 0.96 relative to a total area of a sputtering surface of the target.

The light-emitting layer that contains an optimum 0.4 to 0.6 wt % of manganese is grown with an excellent reproducibility, by compensating beforehand the manganese content increase in the reactive sputtering process described in FIG. 3 by setting the Mn concentration Mn/(ZnS+Mn) in the surface layer of the target at less than 0.5 wt % that is less than 0.8 wt % corresponding to the optimum 0.5 wt % of Mn/(ZnS+Mn) in the light-emitting layer. In the usual temperature range, the optimum Mn concentration Mn/(ZnS+Mn) in the surface layer of the target is from 0.3 to 0.4 wt % when the target is sulfurized and less than 0.1 wt % when the target is not sulfurized.

BRIEF DESCRIPTION OF THE DRAWINGS

FIG. 4 is a diagram schematically showing the second sputtering target employed in the second embodiment of the method for manufacturing according to the present invention, in which

DETAILED DESCRIPTION OF THE PREFERRED EMBODIMENTS

Figure 1:
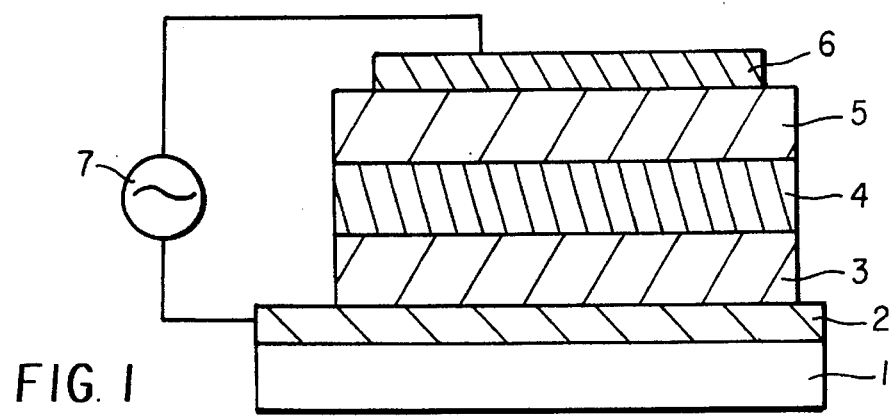
FIG. 1 is a cross sectional view showing the structure of the thin-film EL device manufactured by the method for manufacturing according to the present invention.

The thin-film EL device manufactured by the method of the present invention possesses a dual insulation structure as shown in FIG. 1. The thin-film EL device of FIG. 1 comprises a glass substrate 1; a transparent electrode 2 made of ITO (indium tin oxide) and laminated on the substrate 1 to a thickness of 1700Å; the first insulation layer 3 made of tantalum penta oxide ($Ta_2O_5$) and laminated on the electrode 2 to a thickness of 4000Å; an EL light-emitting layer 4 laminated on the insulation layer 3 to a thickness of 7000Å; the second insulation layer 5 made of $Ta_2O_5$ and laminated on the light-emitting layer 4 to a thickness of 4000Å; and an aluminum back electrode 6 laminated on the second insulation layer 5 to a thickness of 7000Å.

Figure 2:
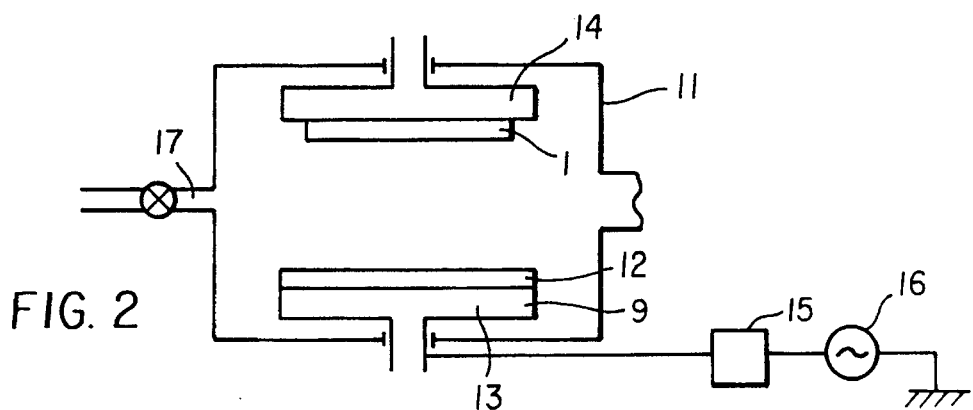
FIG. 2 is a cross sectional view schematically showing the configuration of the sputtering apparatus in which the thin-film EL device is manufactured by the method of the present invention.

FIG. 2 is a sectional view schematically showing sputtering apparatus in which the thin-film EL device is manufactured by the method of the present invention. The sputtering apparatus includes a reaction chamber 11 in which cathode 13 and an anode 14 are positioned oppositely facing each other. A target 12 of 100 mm in diameter and 5 mm in thickness is coated on a surface of the cathode 13. The substrate 1 on which the transparent electrode 2 and the first insulation layer 3 are laminated is disposed on a surface of the anode 14. The cathode 13 is connected via a matching circuit 15 to a 13.56 MHz RF power supply 16 and the anode 14 is grounded.

For growing the light-emitting layer 4, an alloy target (hereinafter referred to as the first target) prepared by melting zinc to which manganese is added and having 0.4 wt % of Mn in Mn/(Zn+Mn) concentration is employed in the first embodiment of the method for manufacturing according to the present invention. A sputtering gas containing an argon gas to which 40% of $H_2S$ is added as a sulfur containing compound gas is fed at the flow rate of 30 sccm (standard $cm^3$/min) through a gas inlet 17 into the reaction chamber 11. The other sputtering parameters include the gas pressure of 10 mTorr, the substrate temperature of 350° C. and the discharge power of 3 W/$cm^3$. Under the sputtering condition described above, the target surface is sulfurized. The grown light-emitting layer 4 is then heat treated in a vacuum furnace at 600° C.

The light-emitting layer 4 thus obtained contains a reproducible 0.4 to 0.6 wt % of Mn in Mn/(Zn+Mn) concentration and the thin-film EL device which employs the thus obtained light-emitting layer 4 shows high luminance of 200 cd/$m^2$ under the applied alternating voltage of 60 Hz.

The Zn-Mn target may be fabricated from a mixture of Zn powder and Mn powder by pressing the mixture to form a target tablet or by sintering the mixture to form a sintered target compact.

Figure 4A:
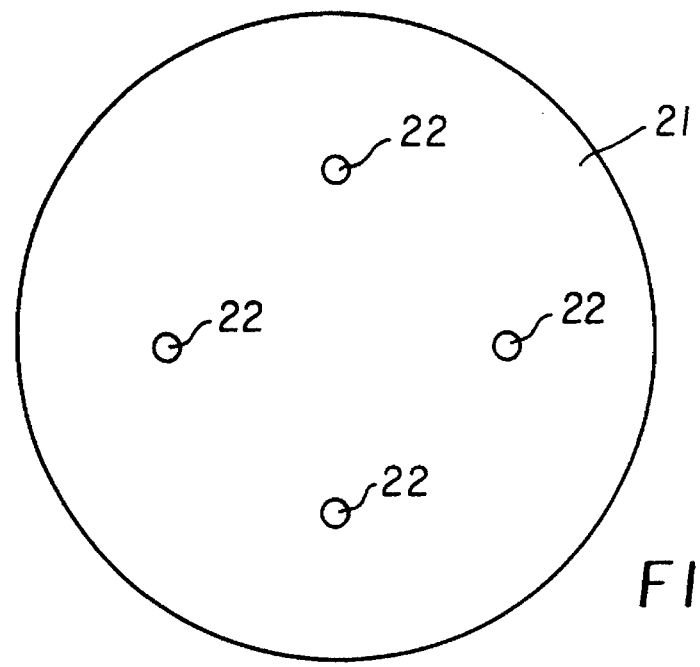
FIG. 4(a) shows a top plan view of the second sputtering target and FIG. 4(b) shows a cross sectional View of the second sputtering target.
Figure 4B:
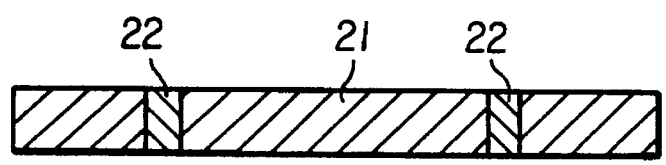

FIG. 4 is a diagram schematically showing the sputtering target employed in the second embodiment of the method for manufacturing according to the present invention, in which FIG. 4(a) shows a top plan view of the second sputtering target and FIG. 4(b) shows a cross sectional view of the second sputtering target. As FIGS. 4(a) and 4(b) show, the sputtering target of the second embodiment is a mosaic target which comprises a plurality of Mn cylinders 22 of 5 mm in thickness and 1 to 5 mm in diameter embedded in a Zn substrate 21 so as to cover 0.38% of an entire area of a surface of the target by Mn. Since the density of Zn is 7.12 and that of Mn is 7.24, the Mn site of 0.38% corresponds to the Mn concentration of 0.4 wt %. By employing the second sputtering target in the state that the surface of which is sulfurized, a light-emitting layer that contains the optimum Mn of from 0.4 to 0.6 wt % in Mn/(Zn+Mn) concentration is obtained under the same layer growth conditions with the first embodiment including the heat treatment after the layer growth.

Figure 5:
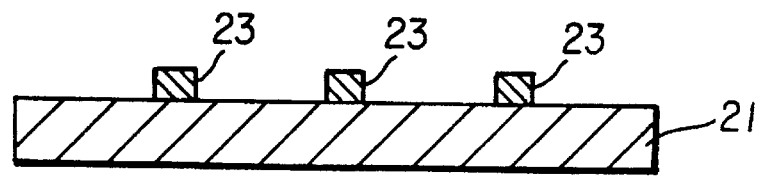
FIG. 5 is a cross sectional view showing the third sputtering target employed in the third embodiment of the method for manufacturing according to the present invention.

FIG. 5 is a cross sectional view showing the third sputtering target employed in the third embodiment of the method for manufacturing according to the present invention. As FIG. 5 shows, the third sputtering target comprises a plurality of circular Mn tablets 23 of 1 mm in thickness and from 1 to 5 mm in diameter disposed on the Zn substrate 21 so as to cover 0.38% of an entire area of a surface of the target by Mn. The third target facilitates finely tuning the Mn area ratio on a sputtering target and growing a light-emitting layer that contains the optimum concentration of Mn under the various substrate temperature.

Figure 3:
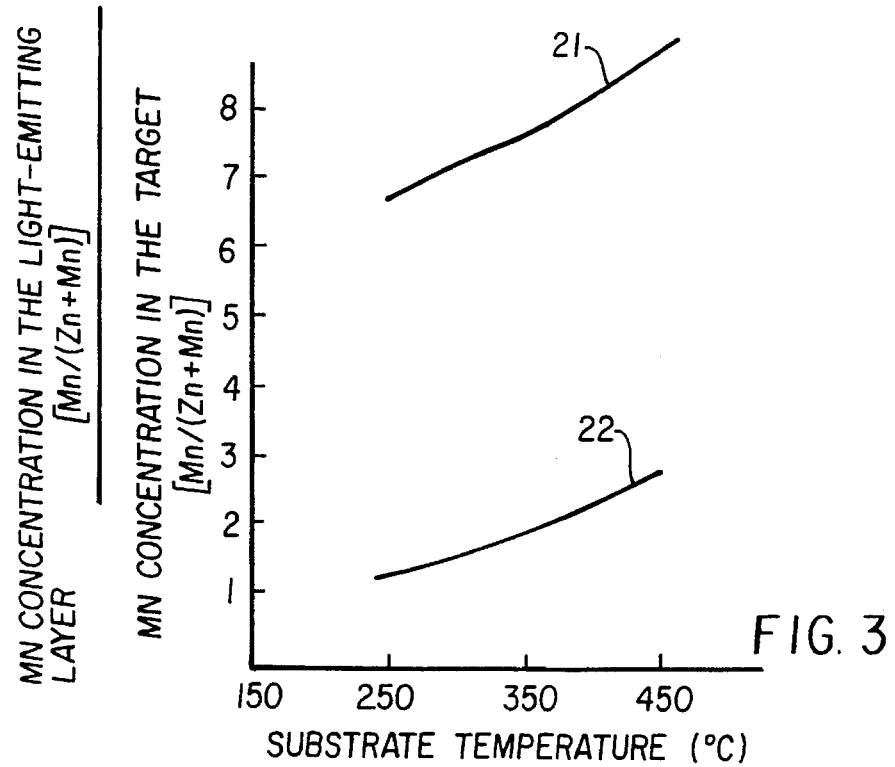
FIG. 3 is a graph showing relationship between the Mn/(ZnS+Mn) concentration ratio of light-emitting layer relative to the Mn/(ZnS+Mn) concentration in the target and the substrate temperature.

Though in the embodiments described above, the light-emitting layers are grown from the targets the surfaces of which are sulfurized, it is obvious from FIG. 3 that a light-emitting layer of the optimum Mn concentration may be grown from a target that contains less than 0.1 wt % of Mn in its surface layer by preventing the surface of the target from sulfurization, for example, by controlling the mixing ratio of the $H_2S$ gas to the sputtering gas.

By the method for manufacturing according to the present invention that employs a Zn-Mn target containing less than 0.5 wt % of Mn in its surface layer and a sputtering gas containing sulfur, a light-emitting layer is obtained by the reactive sputtering technique that contains the optimum 0.5 wt % of Mn relative to the total amount of Mn and ZnS yielded by the reaction between Zn from the target and sulfur contained in the sputtering gas. The method for manufacturing according to the present invention facilitates obtaining a thin-film EL device that shows practically acceptable luminance of more than 100 cd/$m^2$ or more than 150 cd/$m^2$.

What is claimed is:

1. A method for manufacturing a light-emitting layer of a thin-film EL device, comprising the steps of:

fabricating a target having a surface layer which comprises zinc and less than 0.5 wt % manganese; and growing a light-emitting layer comprising zinc sulfide and manganese, the manganese functioning as light-emitting centers, by reactively sputtering from said target in a sputtering gas comprising a sulfur compound.

2. The method of claim 1, wherein substantially the entirety of the target comprises zinc and less than 0.5 wt % manganese.

3. The method of claim 1, wherein at least the surface layer of said target comprises 0.3 to 0.4 wt % of manganese and the surface of said surface layer is sulfurized.

4. The method of claim 1, wherein at least the surface layer of said target comprises less than 0.1 wt % of manganese and the surface of said surface layer is not sulfurized.

5. The method of claim 1, wherein said fabricating step comprises co-melting zinc and manganese.

6. The method of claim 1, wherein said fabricating step comprises pressing a mixture of zinc powder and manganese powder to form a target tablet.

7. The method of claim 1, wherein said target is fabricated to include an exposed manganese region disposed on a zinc substrate, said target having an area ratio of an area of said exposed manganese region to a total area of a sputtering surface of said target, said area ratio being equal to a product of a predetermined wt % of manganese and a density ratio of zinc to manganese, said density ratio being equal to 0.96.

* * * * *